(12) United States Patent
Ackaret et al.

(10) Patent No.: US 7,084,660 B1
(45) Date of Patent: Aug. 1, 2006

(54) SYSTEM AND METHOD FOR ACCELERATED DETECTION OF TRANSIENT PARTICLE INDUCED SOFT ERROR RATES IN INTEGRATED CIRCUITS

(75) Inventors: Jerry D. Ackaret, Beaverton, OR (US); Richard B. Bhend, Rochester, MN (US); David F. Heidel, Mahopac, NY (US); Naoko Pia Sanda, Chappaqua, NY (US); Scott B. Swaney, Catskill, NY (US); Theodore H. Zabel, deceased, late of Yorktown Heights, NY (US); by Jane Jones, legal representative, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/098,104

(22) Filed: Apr. 4, 2005

(51) Int. Cl.
*G01R 31/27* (2006.01)
*H01L 23/58* (2006.01)
*H01L 21/00* (2006.01)

(52) U.S. Cl. ............................ 324/765; 257/48; 438/17
(58) Field of Classification Search ................ 324/765; 257/48; 438/17
See application file for complete search history.

(56) References Cited

U.S. PATENT DOCUMENTS

| 5,533,036 | A | | 7/1996 | Blake et al. ................ 371/40.1 |
| 5,539,203 | A | | 7/1996 | Ohdomari ................ 250/492.21 |
| 6,058,041 | A | * | 5/2000 | Golke et al. ................. 365/156 |
| 6,436,737 | B1 | * | 8/2002 | Malladi ....................... 438/127 |
| 6,507,511 | B1 | | 1/2003 | Barth, Jr. et al. ............ 365/154 |
| 6,708,284 | B1 | | 3/2004 | Smith ........................... 714/10 |
| 6,711,703 | B1 | | 3/2004 | MacLaren et al. ........... 714/704 |
| 6,715,116 | B1 | | 3/2004 | Lester et al. ................. 714/718 |
| 2004/0063288 | A1 | * | 4/2004 | Kenney et al. .............. 438/301 |

FOREIGN PATENT DOCUMENTS

| JP | 1169641 | 7/1989 |
| JP | 2003100904 A | 2/2003 |

OTHER PUBLICATIONS

"Hybrid Cooling With Cycle Steering In The IBM eServer z990", G.F. Goth, D.J. Kearney, U. Meyer, D.W. Porter; IBM J. Res. & Dev., vol. 48, No. 3 / 4, May/Jul. 2004, pp. 409-423.

"A New Comprehensive SRAM Soft-Error Simulation Based On 3D Device Simulation Incorporating Neutron Nuclear Reactions", M. Hane, Y. Kawakami, H. Nakamura, T. Yamada, K. Kumagai, Y. Watanabe; 0-7803-7826-1/03 2003 IEEE, pp. 239-242.

* cited by examiner

*Primary Examiner*—Evan Pert
(74) *Attorney, Agent, or Firm*—Lawrence D. Cutter, Esq.; Jill M. Breedlove, Esq.; Heslin Rothenberg Farley & Mesiti P.C.

(57) ABSTRACT

A method and system are provided for accelerated detection of soft error rates (SER) in integrated circuits (IC's) due to transient particle emission. An integrated circuit is packaged for accelerated transient particle emission by doping the underfill thereof with a transient-particle-emitting material having a predetermined emission rate. The emission rate is substantially constant over a predetermined period of time for testing. Accelerated transient-particle-emission testing is performed on the integrated circuit. Single-event upsets due to soft errors are detected, and a quantitative measurement of SER is determined.

20 Claims, 3 Drawing Sheets

SYSTEM AND METHOD FOR ACCELERATED DETECTION OF TRANSIENT PARTICLE INDUCED SOFT ERROR RATES IN INTEGRATED CIRCUITS

CROSS REFERENCE TO RELATED APPLICATIONS

This application is related to U.S. patent application Ser. No. 11/098,343 (POU920050021US1), assigned to the instant assignee, filed concurrently herewith and incorporated by reference herein.

TECHNICAL FIELD

This invention relates generally to detection of soft errors in electronic systems and, more particularly, to packaging integrated circuits, including logic circuits and array circuits, for accelerated detection of soft error rates due to errors caused by ionizing particle emission.

BACKGROUND OF THE INVENTION

Accurate estimates of soft error rates (SER's) in computer systems are desirable for the implementation of reliable systems. Soft errors are caused by single-event upsets (SEU's), which are random, isolated events that can be caused by passage of cosmic rays or transient ionizing particles, such as alpha particles. That is, ionizing particles can generate enough free charge to flip a structure or device to its opposite state. In an integrated circuit (IC) chip package, emission of trace amounts of radioactive impurities is one cause of SEU's. For wire-bonded structures, accelerated testing using a radioactive source of alpha particles is straightforward. In particular, a source of alpha particles with a known emission rate, such as, for example, a thorium foil, may be easily positioned adjacent to the wire-bonded chip with little energy loss as viewed from the source to the chip.

Unfortunately, however, for integrated circuits (IC's) that use, for example, solder bumps or balls, such as controlled collapsible chip connections (herein referred to as solder bumps), the chip-to-substrate gap is too small (e.g., on the order of 100 microns or less) to allow access by a hand-held radioactive source. Furthermore, the substrate blocks any access to the semiconductor device by a radioactive source, handheld or otherwise. Moreover, the range of alpha particles is substantially smaller than the thickness of the substrate, such that the alpha particles emitted from an external source cannot reach the semiconductor device. Typically, a low alpha emission underfill is inserted into the gap in order to stabilize the solder bond and act as a shield or block for any alpha particles that may emanate from the substrate or carrier.

Eliminating lead from the solder bumps reduces, but does not eliminate, the alpha radiation to the chip. Other sources of alpha particles may be, for example, trace amounts of thorium in chip materials that have been produced from mined ores. In addition, alpha particles from packaging materials, or solder bumps, add to, or compete with, neutron-induced soft errors caused by the liberation of charged particles when atmospheric neutrons strike silicon or other materials surrounding the chips. Disadvantageously, soft errors occur with greater frequency with advances in CMOS and other integrated circuit technologies; i.e., as dimensions get smaller, densities increase, and bias voltages become lower. Furthermore, while soft errors in caches and other static random access memory (SRAM) arrays can be detected and corrected with the aid of error correction codes (ECC's), for example, this is not the case for soft errors in logic circuits.

A current method for estimating soft error rates (SER's) is to add the soft error contributions from each circuit element. To this end, derating factors need to be estimated, and these are affected by, for example, SEU's in a portion of an IC that is not being used, or a node that is in a logical off state. Unfortunately, therefore, these derating factors are difficult to estimate. Furthermore, relying on measurements from systems being tested in the field necessitates delays in acquisition of SER information until after a product is made.

Accordingly, it is desirable to provide a method and system for detecting SER due to transient particle emission in integrated circuits. It is a further object to provide such method and system for detecting SER that is accelerated and in situ, i.e., without having to wait for field testing.

SUMMARY OF THE INVENTION

The shortcomings of the prior art are overcome and additional advantages are provided through a method and system for accelerated detection of SER in integrated circuits (IC's) due to transient particle emission. An IC device is packaged for accelerated transient particle emission by doping the underfill thereof with at least one transient-particle-emitting material having a predetermined, substantially constant emission rate. In one aspect, a radioactive adhesive composition is provided for bonding a semiconductor device to a chip carrier. The radioactive adhesive composition comprises a cured reaction product comprising a resin and a filler, and may be reworkable or non-reworkable. Either the resin or the filler, or both, are doped substantially uniformly with the transient-particle-emitting material, thereby effectively situating the transient-particle-emitting material in close proximity with the IC to be tested. Accelerated transient-particle-emission testing is then performed on the IC in situ. The SER's due to soft errors are detected, and a quantitative measurement of the SER is determined therefrom.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

Presented herein is a technique for detecting SER's due to transient-particle emission in integrated circuits (IC's), including, but not limited to, logic circuits. Logic circuits are defined herein as comprising all structures on an IC apart from SRAM arrays, including but not limited to, combinatorial logic, latches in the logic paths, control circuits, register files, buffers, and input/output circuits.

Figure 1:
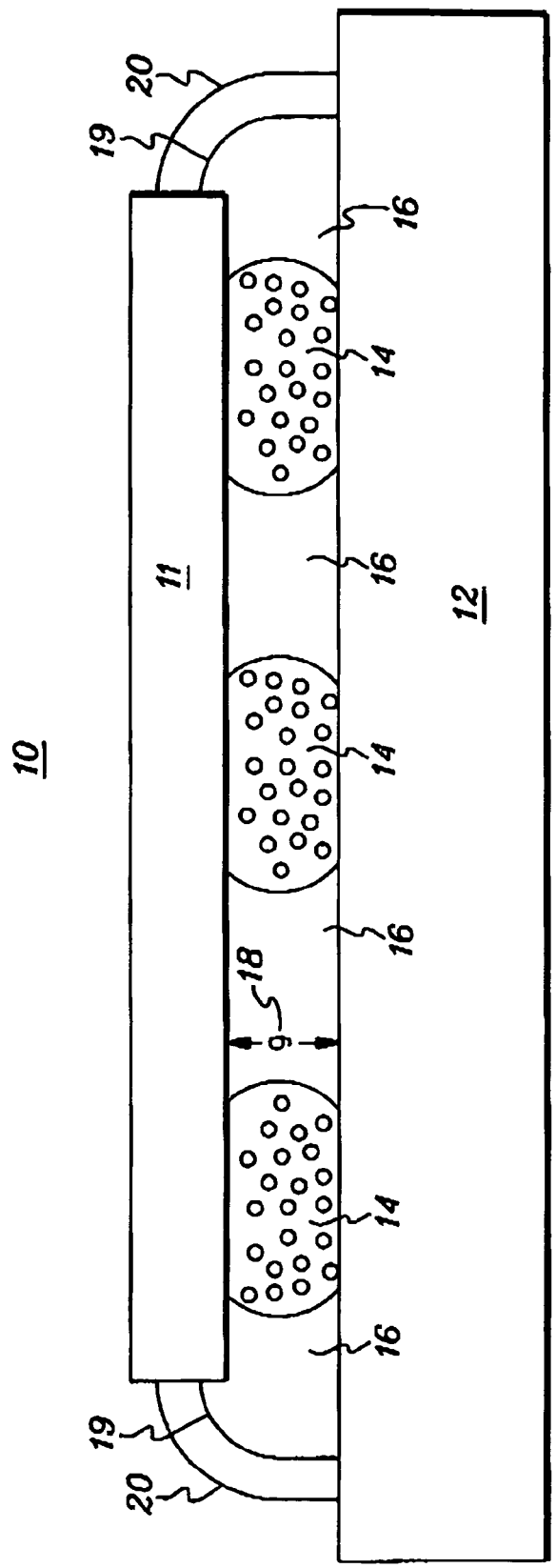
FIG. 1 depicts an integrated circuit (IC) chip having a hot underfill in accordance with an aspect of the present invention.

In accordance with an aspect of the present invention, an IC device is packaged for accelerated transient particle emission by doping the underfill thereof with at least one transient-particle-emitting material having a predetermined emission rate, the doped underfill being referred to herein as a "hot underfill" or "HUF". FIG. 1 illustrates an exemplary IC device 10 comprising a chip 11 attached to a carrier substrate 12 using, for example, controlled collapsible chip connection (C4) bonds 14 and having a doped underfill 16 in accordance with an aspect of the present invention. A gap (g) 18 between the active chip surface and the carrier substrate surface is typically on the order of about, for example, 100 microns. (An exemplary range for the gap may be on the order of 5–125 microns.) The radioactive underfill, or hot underfill, is formulated to flow into the gap between the chip and carrier by, for example, capillary flow, forming a substantially void-free film. The flow characteristics of the hot underfill are such that fillets 19 form from the horizontal carrier surface and climb, or extend above, the vertical thickness of the chip edge.

In preferred embodiments, the volume and surface area of radioactive fillets 19 are reduced in order to minimize emission of radioactive particles to the ambient. A vacuuming or wicking process may be employed to reduce the fillet. In a vacuuming process, for example, a standard pressure feed fluid dispense tool is used in a vacuum pick-up mode to pick up the radioactive underfill fillet. Alternatively, in a wicking process, an exemplary wicking fabric, such as a lint-free clean room cloth, is used to contact the radioactive underfill, which is picked up through wicking action.

After radioactive fillet 19 is substantially reduced in size, a soft-cure, or B-stage cure, is completed to solidify the radioactive underfill. Next, a cold, or undoped underfill material (CUF) 20, that is preferably chemically compatible with the hot underfill, is dispensed over the remaining, substantially reduced-in-size HUF fillet in order to encapsulate it and provide a cover barrier to the radioactive underfill. The underfill is then fully cured, resulting in a structure with any exposed HUF being protected from surface abrasion or erosion by CUF fillet 20, resulting in reduced radioactive emissions to the ambient.

An exemplary underfill comprises a silica filler. A filler material may be electrically conductive or non-conductive, or thermally conductive. An exemplary doped underfill in accordance with an aspect of the present invention comprises radioactive lead or polonium, or a mixture of both, contributing an accelerated alpha-particle emission rate compared to standard IC packaging materials. By way of example, an HUF formulation having an alpha particle emission rate of approximately 1 E6 alpha particles/cm$^2$/khr was used for demonstration. For this example, if the alpha particle flux from packaging materials, such as solder, were 20 alpha particles/cm$^2$/khr, the introduction of HUF would provide an acceleration factor of over 50,000.

Those skilled in the art will recognize that the energy distribution and flux of the HUF could be measured with a silicon surface barrier type detector (not shown). Furthermore, a plurality of silicon surface barrier type detectors could be employed for measuring the uniformity of alpha particle activity across the integrated circuit.

The gap 18 between the substrate 12 and the semiconductor 111 is typically on the order of, for example, 100 microns, as indicated hereinabove. The range of alpha particles from 210 Po (5.3 MeV) in most fillers is on the order of approximately 35 microns. Therefore, when an underfill is doped with an alpha particle emitting isotope, the source appears to be "thick", and the alpha particles advantageously emerge from the filler at the semiconductor side with a broad distribution of energies. This is opposed to a mono-energetic distribution, which would otherwise occur if the doped region were substantially thinner than the alpha-particle range, or if all the radioactive material were segregated on the chip surface.

Figure 2:
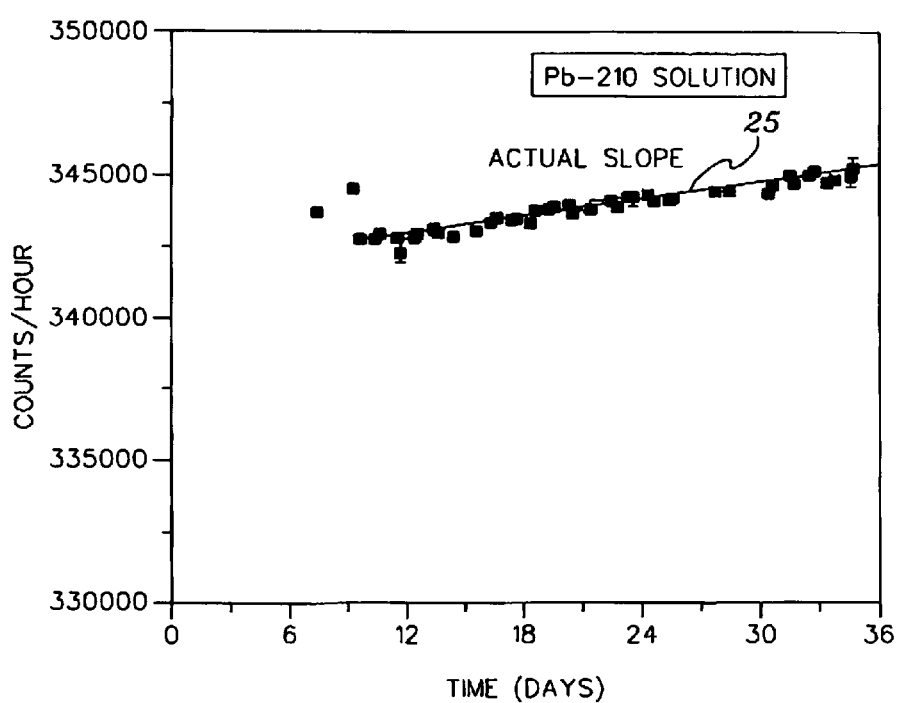
FIG. 2 depicts an alpha particle emission rate as a function of time for an exemplary hot underfill (HUF)

In accordance with an aspect of the present invention, the emission rate of the hot underfill is substantially constant over a predetermined period of time. To this end, the HUF is doped with an appropriate alpha-particle-emitting material or other radioactive source that provides a substantially constant particle emission rate. In particular, the emission rate does not substantially increase or decrease, and thus does not approach an exponential rate. An exemplary substantially constant alpha particle emission rate may have, for example, a 10% or less variation in flux per month. FIG. 2 illustrates an alpha particle emission rate as a function of time for an exemplary HUF. The data points in FIG. 2, collectively depicted by line 25, demonstrate a substantially constant emission of alpha particles from this exemplary HUF. Other suitable emission sources may comprise, for example, thorium, plutonium, uranium, bismuth, etc.; i.e, any of either the natural occurring radioactive sources or manmade isotopes or mixtures thereof, depending on the desired emitted transient particle energy and flux.

By way of example, alpha particles from $^{210}$Po emitted from solder bumps can be a major source of SER for IC's. In accordance with one aspect of the present invention, an underfill comprising $^{210}$Po is provided in order to duplicate the alpha-particle range distribution of the solder bumps. The half-life of $^{210}$Po (138 days) is too short for the duration of most experiments so a mixture with $^{210}$Pb is provided to generate a nearly constant emission rate.

In another aspect of the present invention, one or more components of the underfill may be doped to be radioactive either separately or as a combination. For example, either the resin, the filler, an additive, or a curative portion may be doped before final formulation of the underfill, with either the same or a different dopant. If one or more components or the mixture thereof has been doped, then the HUF is ready for use in an IC. If not, then doping may be alternatively applied to the completed mixture of underfill components before application to the IC.

EXAMPLE

HUF is applied to an IC. The fillet 19 (FIG. 1) is vacuumed out; and the chip edges are cleaned with acetone to remove any HUF not contained under the chip. The device is then soft-cured at 85° C. for 60 minutes. The surface radioactivity, i.e., the alpha particle emission rate in counts per hour, is then measured. CUF is applied to form a new fillet 20 around the chip, encapsulating any exposed HUF. Hard curing is performed at 150° C. for 120 minutes; and the alpha particle emission rate is measured.

The method of doping the underfill of an IC for accelerated SER detection in accordance with an aspect of the present invention may be extended to other radioactive isotopes, such as, for example, thorium or uranium, to mirror the flux and alpha-particle energy distribution from real packaging materials because there might be impurities in materials such as mined silica.

In another aspect of the present invention, the transient particle emission rate may be tunable by adjusting the ratios of the radioactive isotopes, e.g., $^{210}$Po and $^{210}$Pb that are mixed together in the underfill.

In an alternative embodiment, an underfill may be removed and reworked, allowing a chip or substrate to be recovered. That is, a reworkable underfill comprises an initially undoped underfill that may be doped in accordance with an aspect of the present invention. Such a reworkable underfill process flow comprises initially decomposing the underfill, and then removing the chip from the carrier, e.g., by solder melting. Residues are removed, and the site is cleaned. A new chip is mounted; and the underfill process is repeated.

In accordance with another aspect of the present invention, accelerated transient-particle emission testing is performed on IC 10. Advantageously, this testing may be performed in situ on IC 10, i.e., without necessitating delays due to field testing. In particular, the hot underfill (HUF) allows for accelerated testing for transient-particle-induced (e.g., alpha-particle-induced) SER events at the system level, board level, chip level, or any combination thereof. The test type may be of any suitable form, including, for example, but not limited to, actual application programs and data; programs and data that simulate applications or test cases; test programs that are intended to stress certain desired cases, functions, or parts of a system; a built-in self-test; static tests that read in 1's and 0's, then wait, and then read out the results and detect the SEU's. For each test type, the result can be tested for upsets by either detecting a system crash (i.e., termination); detecting an error through detection circuitry, such as a parity checker; comparing the resulting data stream to the expected data stream; comparing duplicate structures; mathematical methods for checking computations, e.g., residue checking; or any other suitable method. When the results are read out, they are counted to form a SER per circuit, or per bit, as desired.

Figure 3:
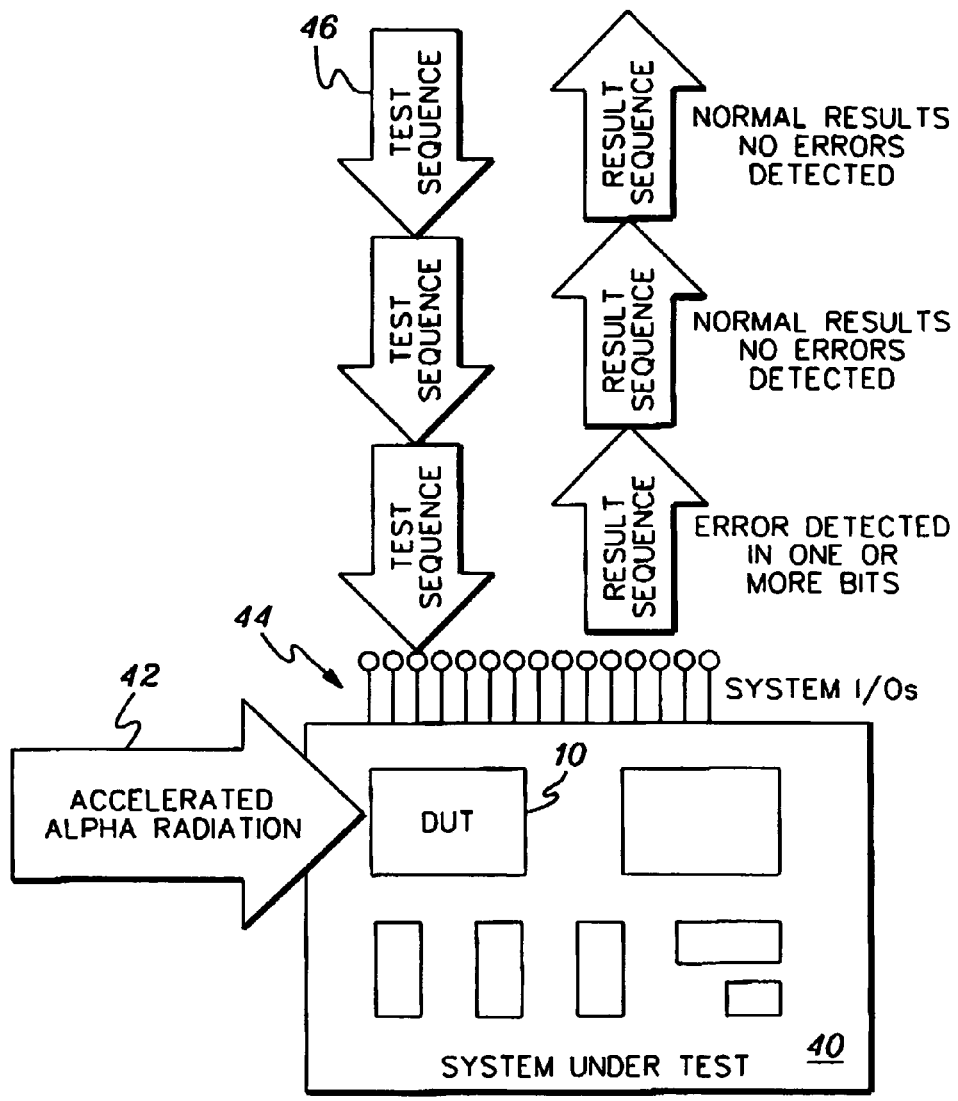
FIG. 3 depicts IC chips, such as illustrated in FIG. 1, incorporated into a device under test (DUT), which is incorporated into a system for accelerated transient-particle emission testing in accordance with an aspect of the present invention.

By way of example, FIG. 3 illustrates IC 10 incorporated in a product level system device under test (DUT) 40 for product level testing by accelerated transient-particle-emission 42. As shown, the DUT 10, having an underfill doped with radioactive isotopes, i.e., a hot underfill, as described hereinabove with respect to FIG. 1, is incorporated into a System Under Test (SUT) 40, illustrated as having inputs and outputs (I/O's) 44. Those of ordinary skill in the art will appreciate that the exemplary DUT 10, as described hereinabove with respect to FIG. 1, is provided by way of example only. Other DUT's having different fill compositions, as described hereinabove, may be used in a system under test for measuring soft error rates due to transient particle emission in accordance with the principles of the present invention.

FIG. 3 illustrates application of a test sequence 46, which may comprise, for example, an exerciser, such as an architectural verification test program, for example. The test sequence of FIG. 3 is provided by way of example only; alternative suitable test types may be utilized, as described hereinabove and as will be understood by those of ordinary skill in the art.

By way of illustration, one exemplary test method is referred to herein as a hand loop method for RAM SER measurement. By such method, for an array element, such as a SRAM or DRAM, a known pattern may be stored into the array. Such a pattern may be of any suitable type, such as, for example, all 0's or all 1's, a regular pattern, or an arbitrary pattern. All bits are read out and compared to the original bits. Mismatches in comparisons are faults, and the locations of faults are recorded. The array is tested again. If there is no fault, then the original fault was a soft error. If, on the other hand, the fault is not there, then it is most likely a hard, or permanent, error. All bits are read until the test is completed, at which point the accelerated bit error rate of the structure is computed. The bit error rate is then determined from the accelerated bit error rate by dividing the raw error rate by the acceleration factor of the HUF. Automatic reading of the array may be enabled by a looping program. A loop may be programmed by hand, for example, in the case of a microprocessor cache in order to repeatedly read the cache.

Another exemplary test method comprises a static test for latches. For latches that can be configured to be connected together in scan test mode, for example, a test sequence of 0's and 1's may be applied into the scan latch chain. After an interval of time, the data is read out and compared to the bit stream that was originally read as input.

Advantageously, any suitable test program designed to detect faults could be applied in accordance with the principles of the present invention to detect SEU's. When a fault is detected, the test is repeated in order to determine if the fault is hard or soft. Non-repeatable faults are soft errors and are counted in the test results.

Additionally, testing may be performed by running applications on an operating system, if desired. Test sequences may be repeated, as described hereinabove, for verification of soft errors.

An additional use for HUF is for verification of error recovery. Error recovery testing via hot underfill methods, as described herein, are implemented in hardware, software, or by using a combination of hardware and software. The trend for future CMOS and other integrated circuit chip technologies, and for computing technologies beyond CMOS, is toward devices which are less predictable and which, therefore, more strongly rely on recovery-oriented computing. Hot underfill (HUF) methods provide uniform elevation of alpha particle flux across all of the structures within any integrated circuit chip and particularly those chips which include a computing element. HUF is applied to a computing element as part of product qualification processes to enable errors in the recovery operation to be revealed and corrected before products are released.

The usefulness of HUF as a recovery test tool is that it is capable of reproducing recovery problems even in data process systems which would normally be fixed with a code patch. For example, it is capable of reproducing single bit errors occurring within a SRAM array on a processor chip. When problems like this occur, it is possible for a single soft error in the array to not be properly reset during recovery, thus resulting in a soft error persisting as if it were a hard error. Such problems are very difficult to debug. For example, certain system test tools are not able to create exactly the same errors (as for example, in a given SRAM array) to reproduce these kinds of problems. however, the processes, materials and methods of the present invention do have this capability. A significant value of HUF is therefore seen to be its ability to create true single event upsets within integrated circuit components such as SRAM arrays.

Still an additional use for HUF in accordance with the present invention is to provide HUF services. That is, it is desirable for IC providers to obtain chip, board and system level measurements of SER under different test and application conditions. Such conditions may include, but are not limited to, verification of recovery from SEU's, as described hereinabove. Further, such an HUF service may include applying HUF to a customer-provided flip-chip attached device, for example. Such a device may be a single-chip module, a dual-chip module, a multi-chip module, a board, or any other device configuration to which HUF may be applied. Following application of the HUF, the device may be returned to the customer for testing. After testing, the device is retained or disposed of in accordance with applicable regulations for radioactive materials, i.e., since the decay time for HUF radioactivity is relatively long (e.g., for an exemplary application, the half-life of $^{210}$Pb is 22 years). The service provider could provide HUF retention or disposal services, if desired.

Alternatively, the service provider could perform the HUF testing in accordance with customer specified conditions and objectives. Such testing may involve use of customer-specified or customer-supplied hardware, software, test sequences, and documentation. Such testing may further include any of the following: design of the experiment; setting goals for measurements; determining desired HUF alpha particle flux based on predictions for the customer's device(s); design of the test strategy; development of the tests; analysis of results; and design of devices and systems for improved soft error detection.

The present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method for detecting soft errors in an integrated circuit due to transient-particle emission, comprising:
    doping the integrated circuit with at least one transient-particle-emitting material having a predetermined, substantially constant emission rate; and
    testing the doped integrated circuit to identify single-event upsets.

2. The method of claim 1, wherein the doping comprises doping an underfill of an integrated circuit device.

3. The method of claim 1, wherein the testing comprises identifying single-event upsets by parity checking.

4. The method of claim 1, wherein the testing comprises identifying single-event upsets by comparing resulting data to expected data.

5. The method of claim 1, wherein the testing comprises identifying single-event upsets by residue checking.

6. The method of claim 1, wherein the testing comprises identifying single-event upsets by comparing integrated circuit structures.

7. The method of claim 1, wherein the integrated circuit is incorporated into a system for testing.

8. The method of claim 7 wherein the testing comprises identifying single-event upsets by detecting a system termination.

9. The method of claim 1 wherein the integrated circuit comprises solder bonds, and the transient-particle-emitting material emits alpha particles.

10. The method of claim 1, further comprising repeating the testing in order to separate soft errors from hard errors.

11. A system for detecting soft errors due to transient-particle emission in an integrated circuit, comprising:
    an integrated circuit doped with at least one transient-particle-emitting material having a predetermined, substantially constant emission rate; and
    testing means for applying a test to the integrated circuit to identify single-event upsets.

12. The system of claim 11, wherein the integrated circuit comprises an underfill doped with the at least one transient-particle-emitting material.

13. The system of claim 11, wherein the testing means comprises a parity checker.

14. The system of claim 11, wherein the testing means comprises means for comparing resulting data to expected data.

15. The system of claim 11, wherein the testing means comprises means for residue checking.

16. The system of claim 11, wherein the testing means comprises means for comparing integrated circuit structures.

17. The system of claim 11, wherein the testing means comprises means for detecting a system termination.

18. The system of claim 11 wherein the integrated circuit comprises solder bonds, and the transient-particle-emitting material emits alpha particles.

19. The system of claim 11, further comprising means for repeating the testing in order to separate soft errors from hard errors.

20. The system of claim 11, further comprising at least one silicon surface barrier type detector for measuring transient particle activity.

\* \* \* \* \*